United States Patent
Louwers et al.

(10) Patent No.: US 6,177,715 B1
(45) Date of Patent: Jan. 23, 2001

(54) INTEGRATED CIRCUIT HAVING A LEVEL OF METALLIZATION OF VARIABLE THICKNESS

(75) Inventors: Stephan Louwers, Crolles; Michel Marty, Gentilly-Cedex, both of (FR)

(73) Assignees: U.S. Philips Corporation, New York, NY (US); STMicroelectronics SA, Gentilly-Cedex (FR)

(*) Notice: Under 35 U.S.C. 154(b), the term of this patent shall be extended for 0 days.

(21) Appl. No.: 09/486,149

(22) PCT Filed: Jun. 17, 1999

(86) PCT No.: PCT/IB99/01129

§ 371 Date: Feb. 22, 2000

§ 102(e) Date: Feb. 22, 2000

(87) PCT Pub. No.: WO99/67823

PCT Pub. Date: Dec. 29, 1999

(30) Foreign Application Priority Data

Jun. 23, 1998 (FR) ................................... 98 07935

(51) Int. Cl.[7] .................. H01L 21/20; H01L 21/44; H01L 23/48; H01L 29/00
(52) U.S. Cl. ................... 257/531; 257/775; 438/381; 438/671; 438/673
(58) Field of Search .................. 438/381, 669, 438/671, 673; 257/531, 775

(56) References Cited

U.S. PATENT DOCUMENTS

| | | | |
|---|---|---|---|
| 4,418,470 | * 12/1983 | Naster et al. | 438/381 |
| 4,718,977 | * 1/1988 | Contiero et al. | 438/699 |
| 4,914,056 | * 4/1990 | Okumura | 438/671 |
| 4,960,489 | * 10/1990 | Roeska et al. | 438/669 |
| 5,370,766 | * 12/1994 | Desaigoudar et al. | 438/381 |
| 5,384,274 | * 1/1995 | Kanechachi | 438/381 |
| 5,652,157 | 7/1997 | Hirano et al. | 437/40 |
| 5,930,637 | * 7/1999 | Chuang et al. | 438/381 |
| 5,936,299 | * 8/1999 | Burghartz et al. | 257/531 |

FOREIGN PATENT DOCUMENTS

| | | |
|---|---|---|
| 0471376 A2 | 2/1992 | (EP) . |
| 0706211 A2 | 4/1996 | (EP) . |
| 0778593 A1 | 6/1997 | (EP) . |

OTHER PUBLICATIONS

International Search Report PCT/IB 99/01129.

* cited by examiner

Primary Examiner—T. N. Quach
(74) Attorney, Agent, or Firm—Steven R. Biren

(57) ABSTRACT

An integrated circuit comprising at least one level of metallization, the level of metallization being provided with tracks and comprising metal portions having at least two different thicknesses. The level of metallization comprises at the same time at least one inductor and at least one track, the track being formed on a portion of small thickness, and the inductor being formed on a portion of large thickness.

7 Claims, 3 Drawing Sheets

INTEGRATED CIRCUIT HAVING A LEVEL OF METALLIZATION OF VARIABLE THICKNESS

BACKGROUND OF THE INVENTION

The invention relates to an integrated circuit comprising at least one level of metallization, the level of metallization being provided with tracks and comprising metal portions of at least two different thicknesses.

A level of metallization usually comprises metal tracks of small thickness, for example 1 micron, and small width, for example 1 micron. These metal tracks are used to transfer logic data. To manufacture inductors with an inductance of several nanohenrys, a separate level of metallization may be provided which is employed only for this purpose. In order to reduce the resistance of these inductors, particularly the direct-current resistance, use is made of inductors having a large width of, for example, 20 $\mu$m, and a large thickness of, for example, 2.5 $\mu$m.

However, it is rather unsatisfactory to use a level of metallization only for inductors as a large area of this level of metallization remains unused. For this reason it would be desirable to take measures enabling said level of metallization to also comprise tracks for the transfer of logic data, said tracks having a small width. However, it is very difficult to manufacture tracks which are narrow and thick.

SUMMARY OF THE INVENTION

It is an object of the present invention to provide an integrated circuit having a level of metallization comprising both an inductor and a track for, for example, transfer of logic data.

To achieve this, the integrated circuit in accordance with the invention is characterized in that the level of metallization comprises at the same time at least one inductor and at least one track, the track being formed on a portion of small thickness, and the inductor being formed on a portion of large thickness.

The coupling between the turns of wire of the inductor is only slightly affected by the profiles of the portions having a large thickness, which include a first part at the bottom of the step having a straight edge and a second concave part.

In an embodiment of the invention, the level of metallization comprises a first metal layer and a second metal layer, which are separated by a stop layer. The second metal layer may have a larger thickness than the first metal layer.

A further object of the invention is to provide a method of manufacturing a level of metallization of an integrated circuit, the level of metallization being provided with tracks. A first metal layer is provided, whereafter a stop layer and a second metal layer are applied. A first mask of a resin is provided on the circuit. The second metal layer is subjected to photoetching down to the stop layer. A second resin mask is deposited on the circuit. The stop layer and the first metal layer are etched, in such a manner that portions comprising the first metal layer and the second metal layer and portions comprising only the first metal layer remain intact.

After photoetching the second metal layer, the first mask may be removed or preserved.

In this manner, an integrated circuit is obtained wherein the use of a level of metallization is optimized, which enables the number of levels of metallization to be reduced, resulting in a smaller thickness of the integrated circuit and in a saving in costs owing to the smaller number of process steps, or, the performance of the integrated circuit to be increased if the number of levels of metallization remains unchanged.

These and other aspects of the invention will be apparent from and elucidated, by way of non-limitative example, with reference to the embodiment(s) described hereinafter.

DESCRIPTION OF THE PREFERRED EMBODIMENTS

Figure 1A:
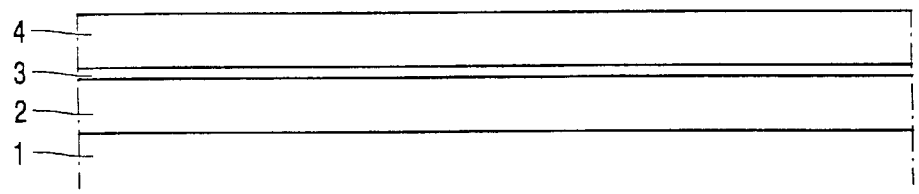
FIGS. 1a through 1f are diagrammatic, cross-sectional views of a method in accordance with the invention.

As shown in FIG. 1a, a first metal layer 2 is deposited, in a thickness of approximately 1 $\mu$m, on the upper dielectric layer 1 of an integrated circuit. Subsequently, a stop layer 3 having a small thickness of, for example, 300 Å is deposited on the first metal layer 2. This stop layer 3 may be made from titanium or titanium nitride. Next, a second metal layer 4, having a thickness of for example 2 $\mu$m, is deposited.

Figure 1B:
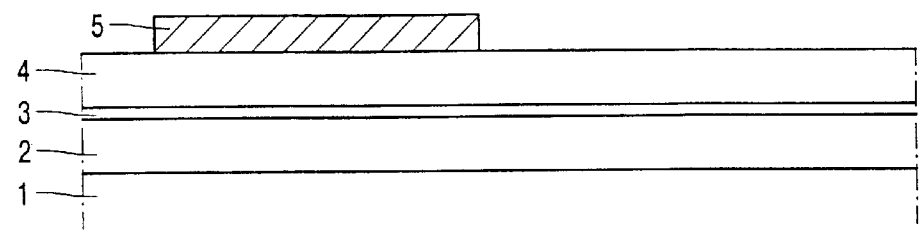

In the step shown in FIG. 1b, a first resin mask 5 is provided on the second metal layer 4. The areas protected by the mask 5 are defined by means of a photorepeater.

Figure 1C:
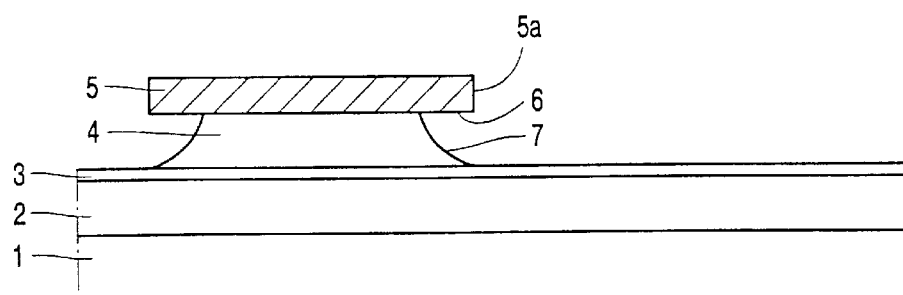

FIG. 1c shows that the second metal layer 4 is subjected to an etching process, i.e. an isotropic wet etching process. By means of said wet etching process the second metal layer 4 can be removed, with the exception of the regions protected by the mask 5. However, the regions 6 of the second metal layer 4 adjoining the lateral edges 5a of the mask 5 are subject to erosion during said wet etching process. This erosion results in a concave lateral edge of the second metal layer 4. Etching stops at the stop layer 3 by virtue of the selectivity of the process with respect to a titanium nitride layer. In this manner the future portions of large thickness of the level of metallization of the integrated circuit are defined.

Figure 1D:
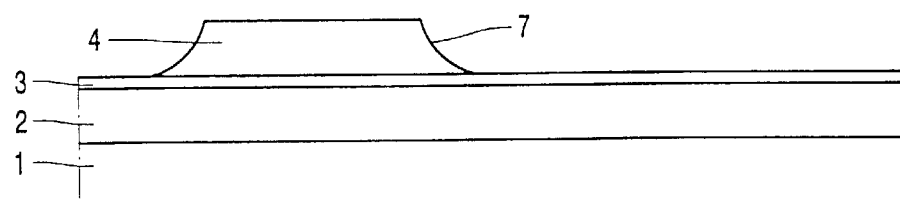

FIG. 1d shows that, subsequently, the mask 5 is removed.

Figure 1E:
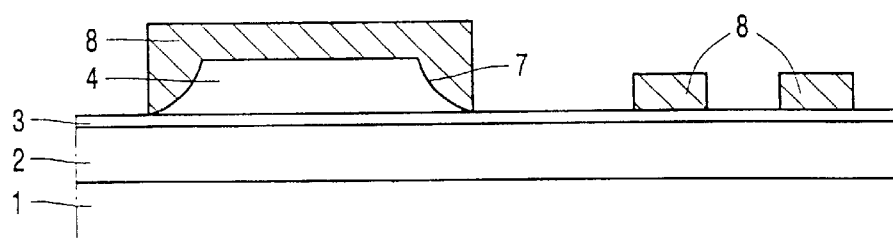

Next, a second resin mask 8 is provided, see FIG. 1e. This mask 8 covers the regions previously covered by the first mask 5, which regions are used to form the portions of large thickness, and it covers other, previously etched, regions which serve to form portions of small thickness. Next, the integrated circuit is etched in a plasma-anisotropic process, so that the regions of the stop layer 3 and the first metal layer 2 which are not protected by the mask 8 are removed. As described hereinabove, the resin mask 8 is subsequently removed.

Figure 1F:
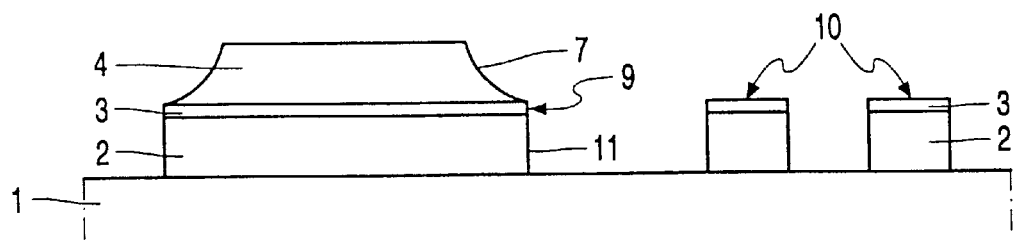

As shown in FIG. 1f, two types of patterns are obtained. A first type is formed by the portions of large thickness 9, which are composed of the first metal layer 2, the stop layer 3 and the second metal layer 4, and a second type is formed by portions of small thickness 10 which are composed only of the first metal layer 2 and the stop layer 3, the plasma-etching process having stopped at the dielectric layer 1. The portions of large thickness 9 may be used as inductors having a thickness above 3 $\mu$m and a width of the order of 20 $\mu$m, while the portions of small thickness 10 constitute tracks of a logic circuit, their thickness and width ranging between 1 and 1.5 $\mu$m.

It is noted that the concave edges 7 of the portions of large thickness 9 have not been modified by the plasma-etching step because they were covered with the second resin mask 8, see FIG. 1e. As a result, the portions of large thickness 9 comprise an edge having a complex profile, i.e. the concave edge 7 at the level of the second metal layer 4 and a straight edge 11 at the level of the first metal layer 2. This arrangement does not present any drawback in terms of reduction of the section of portion 9, because the surface of the region 6 where the metal of the layer 4 has been removed is very small with respect to the whole of the portion of large thickness 9.

As a matter of fact, it is assumed that the width of the region 6 will be smaller than or equal to the thickness of the second metal layer 4 wherein it has been formed. The portion of large thickness 9 will have maximally lost, at its top part, a part of its width which corresponds to approximately twice the thickness of the second metal layer 4. The resistance value is not significantly increased thereby. An advantage of a profile having two slopes is that it has an obtuse angle at the top of the step. By virtue of this characteristic, the concentration of stresses in the upper passivating layer of the circuit is limited. In short, this method enables inductors having a very large thickness, of for example, 4 μm to be obtained, which cannot be manufactured in a single metal layer since etching of such a layer would require the deposition of a resin layer in a thickness equal to that of the inductor, which could not be insulated in a suitable manner.

In practice, this method can be used in combination with a first metal layer having a thickness ranging between 0.6 and 1 μm and a second metal layer having a thickness ranging between 1 and 4 μm.

The deposition of the three layers, i.e. first metal layer, stop layer and second metal layer, can be carried out one after the other, thereby achieving substantial savings in the production process.

Figure 2A:
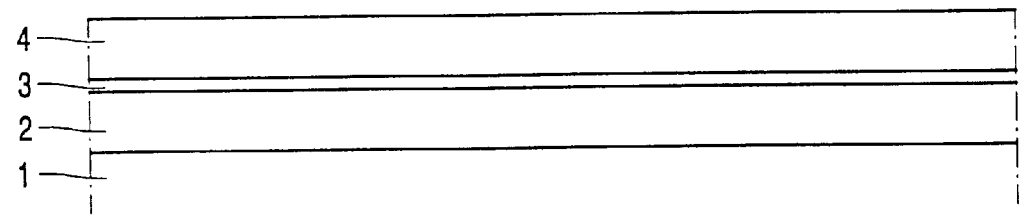
FIGS. 2a through 2f show a modification of the preceding Figures.
Figure 2B:
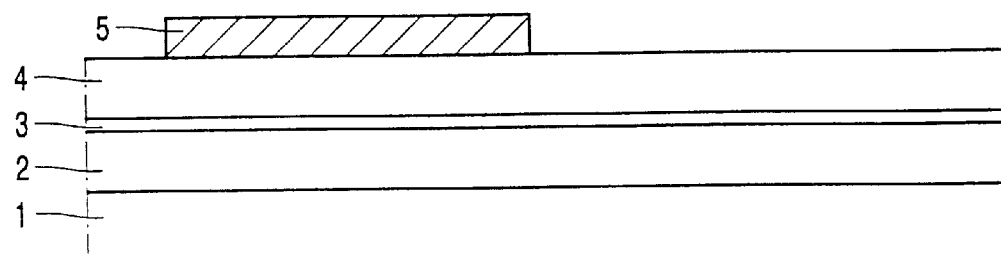
Figure 2C:
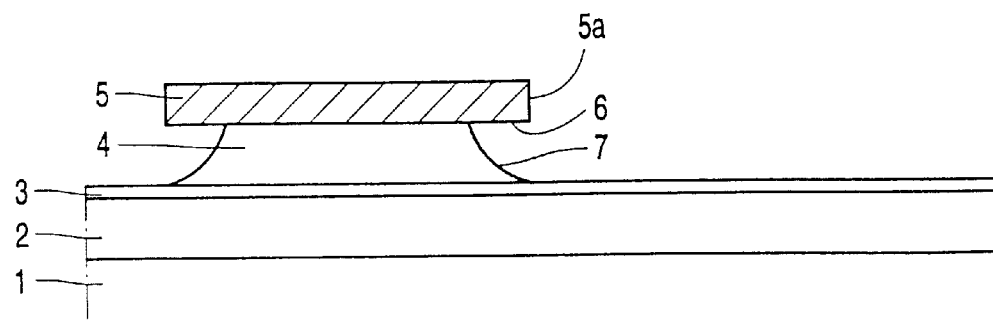
Figure 2D:
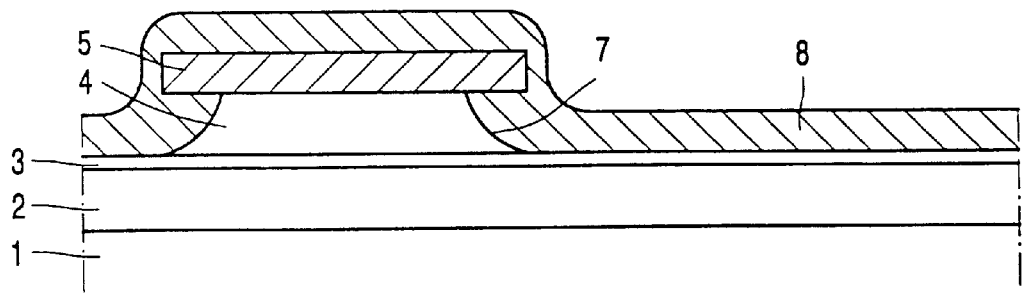
Figure 2E:
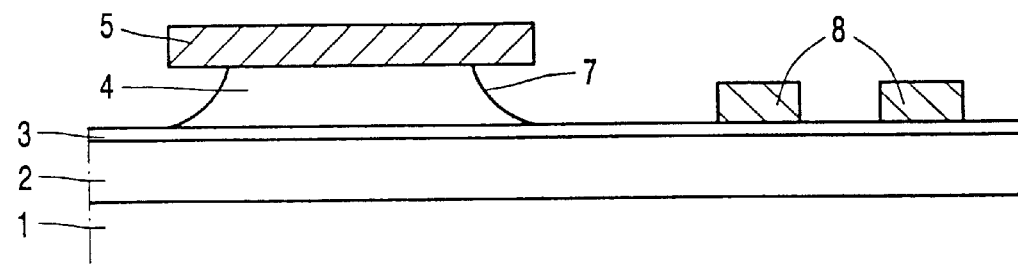
Figure 2F:
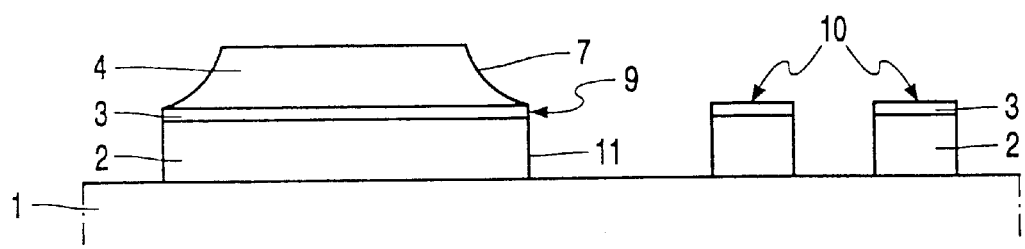

The embodiment shown in FIGS. 2a through 2f is similar to the preceding embodiment, with the exception that the first resin mask 5, which is shown for example in FIG. 2c and which protects the second metal layer 4, is not removed but preserved for the following step shown in FIG. 2d wherein the second resin mask 8 is deposited and, subsequently, developed in a second photolithographic step, which results in the circuit shown in FIG. 2e.

This modification of the method enables the precision of the etching process to be increased. As a matter of fact, the portion of large thickness 9 is defined only by the first mask 5, while the portions of small thickness 10 are defined only by the second mask 8. In this manner, any mistake in repositioning the photorepeater during the development of the second mask is avoided, which mistake could cause a relative displacement of the first metal layer 2 and the second metal layer 4 forming the portions of large thickness 9.

By virtue of the invention, an integrated circuit is obtained having metal portions of different thicknesses for the same level of metallization, which enables a better use of said level of metallization.

What is claimed is:

1. An integrated circuit comprising at least one level of metallization, the level of metallization being provided with tracks and comprising metal portions of at least two different thicknesses, characterized in that the level of metallization comprises at the same time at least one inductor and at least one track, the track being formed on a portion of small thickness, and the inductor being formed on a portion of large thickness.

2. A circuit as claimed in claim 1, characterized in that the portion of large thickness comprises a first part having a straight edge and a second part having a concave edge.

3. A circuit as claimed in claim 1, characterized in that the level of metallization comprises a first metal layer and a second metal layer, which are separated by a stop layer.

4. A circuit as claimed in claim 3, characterized in that the thickness of the second metal layer is larger than the thickness of the first metal layer.

5. A method of manufacturing a level of metallization of an integrated circuit, the level of metallization being provided with tracks, comprising depositing a first metal layer, depositing a stop layer, depositing a second metal layer, depositing a first resin mask, then photoetching the second metal layer down to the stop layer, depositing a second resin mask, and then photoetching the stop layer and the first metal layer in such a manner that portions comprising the first metal layer and the second metal layer and portions comprising only the first metal layer remain intact.

6. A method as claimed in claim 5, wherein the first mask is removed after the second metal layer has been subjected to a photoetching process.

7. A method as claimed in claim 5, wherein the first mask is preserved after the second metal layer has been subjected to a photoetching process.

* * * * *